United States Patent [19]

Roesner

[11] Patent Number: 4,796,074
[45] Date of Patent: Jan. 3, 1989

[54] METHOD OF FABRICATING A HIGH DENSITY MASKED PROGRAMMABLE READ-ONLY MEMORY

[75] Inventor: Bruce B. Roesner, San Diego, Calif.

[73] Assignee: Instant Circuit Corporation, San Diego, Calif.

[21] Appl. No.: 42,682

[22] Filed: Apr. 27, 1987

[51] Int. Cl.$^4$ .................. H01L 27/02; H01L 29/48; H01L 29/04
[52] U.S. Cl. ........................... 357/51; 357/15; 357/40; 357/47; 357/59
[58] Field of Search .............. 357/15, 59 A, 59 F, 357/59 I, 59 K, 40, 51, 47; 365/100, 105, 103

[56] References Cited

U.S. PATENT DOCUMENTS

| | | | |
|---|---|---|---|
| 4,442,507 | 4/1984 | Roesner | 365/96 |
| 4,569,120 | 2/1986 | Stacy et al. | 357/45 |
| 4,569,121 | 2/1986 | Lim et al. | 357/45 |
| 4,599,705 | 7/1986 | Holmberg et al. | 357/51 |
| 4,692,787 | 9/1987 | Possley et al. | 357/50 |

Primary Examiner—J. Carroll
Assistant Examiner—Ngan Van Ngo
Attorney, Agent, or Firm—Beehler, Pavitt, Siegemund, Jagger, Martella & Dawes

[57] ABSTRACT

The word line pitch within a read-only memory is decreased, thereby increasing the cell density within the memory, without imposing any additional or stricter spacing rules or fabrication techniques utilized in the manufacture of the read-only memory integrated circuit chip. The read-only memory is comprised of a plurality of memory cells. A two-dimensional semiconductor diode layer is laid down on a plurality of word lines which have previously been disposed upon a semiconductor supporting substrate. The semiconductor diode layer is disposed on the plurality of word lines without regard to any alignment criteria. A programmable material is inlaid on the Schottky diodes and a plurality of bit lines laid upon the programmable material. The bit lines and word lines are orthogonally disposed with respect to the Schottky diodes so that each diode is uniquely addressed by one word line and one bit line. The programmable material may be laid upon the Schottky diode as a two-dimensional layer or as a plurality of strips or paths without regard to any alignment criteria. Because a single alignment is required in each of two orthogonal dimensions between the word line and the Schottky diode in one dimension, or the bit line and Schottky diode in another dimension, the center-to-center word line or bit line pitch is reduced to four microns and utilizing a fabrication methodology based a two-micron rule.

10 Claims, 2 Drawing Sheets

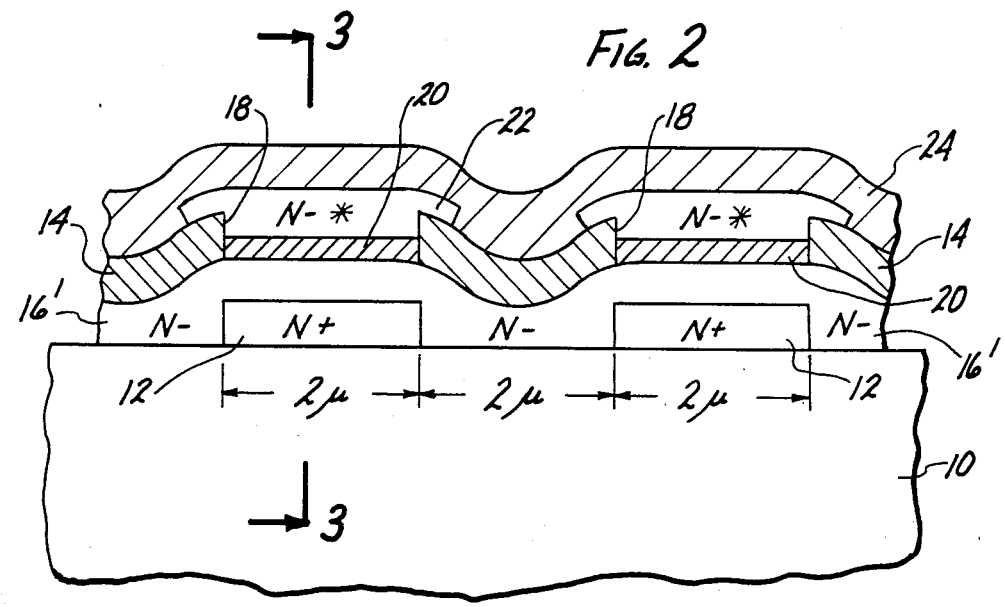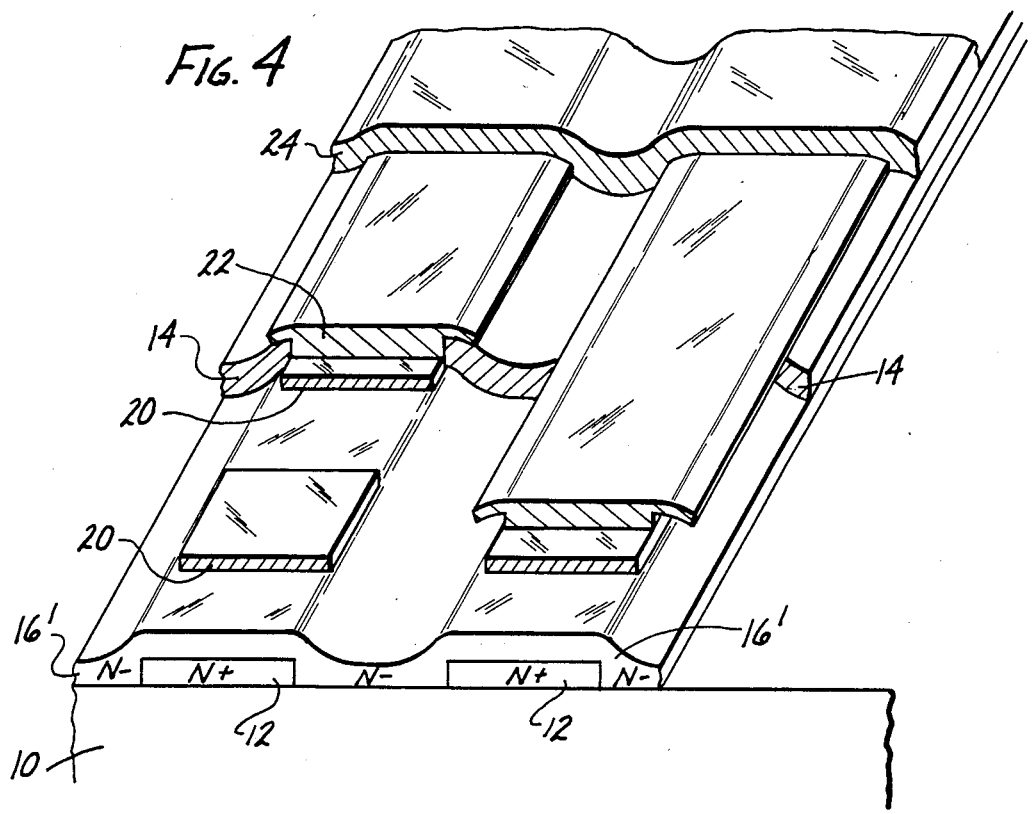

METHOD OF FABRICATING A HIGH DENSITY MASKED PROGRAMMABLE READ-ONLY MEMORY

BACKGROUND OF THE INVENTION

1. Field of the Invention

The invention relates to the field of semiconductor memories as fabricated in integrated circuits and more particularly to a read-only memory and a method for fabricating the same at a high number of devices per unit area of semiconductor chip, i.e. high device density.

2. Description of the Prior Art

Ever since the invention of a first integrated circuit, the micro-miniaturization of semiconductor circuits, particularly digital memories, has progressed by decreasing the size of the semiconductor chip allocated to each memory cell and/or increasing the size of the chip.

The ability to increase the size of the chip is typically limited by substantial loss in yield as the chip area increases. Attempts to decrease the sources of defects in the chips, which cause yields to suffer, have been very complex and uneconomically expensive.

Similarly, substantial efforts in the integrated circuit industry in reducing the size of individual circuit components within a given area have reached and pushed the inherent limitations of electron beam lithography or X-ray lithography in the attempt to reliably fabricate components with geometries of less than two microns in any one dimension. Further micro-miniaturization beyond a two-micron rule or step has thus far been exceedingly expensive and generally limited by the inherent effects of electron scattering and proximity effects within the semiconductor devices thus fabricated.

As a result, substantial efforts have been undertaken to derive suitable designs for a memory cell within a read-only memory which can be reliably fabricated in high densities within the inherent limitations of current manufacturing techniques. Examples of such designs are shown in Roesner, "Method of Forming a Metal Semiconductor Field Effect Transistor", U.S. Pat. No. 4,358,891 (1982); Roesner, "Mask Programmable Read-Only Memory Stacked above a Semiconductor Substrate", U.S. Pat. No. 4,424,579 (1984); Roesner et al., "Reduced-Area, Read-Only Memory", U.S. Pat. No. 4,598,386 (1986); and Roesner, "Electrically Programmable Read-Only Memory Stacked above a Semiconductor Substrate", U.S. Pat. No. 4,442,507 (1984), each of which references are herein expressly incorporated by reference for the enablement purpose of the present disclosure.

The relevance of the prior art is best understood in the context of the art as shown by Roesner '507. Refer particularly to FIG. 11 of that patent, a version of which is recreated here as FIG. 1, and which shows two adjacent cells. The cells are disposed in an insulating substrate 10 on which a heavily N doped word line 12 has been disposed within an etched cavity in an overlying insulating layer 14. A lightly N doped diode layer 16 is disposed on and in contact with word line 12. The width, as seen through the cross-sectional view of FIG. 1, of each cell, as defined by its word line width, is approximately 4 microns. A space of 2 microns separates the two adjacent cells, since the 2-micron rule dictates that the minimum spacing which can be reliably defined by present commercial production techniques is 2 microns.

A silicide of a noble metal is disposed within the aperture 18 of each cell in contact with diode layer 16. A Schottky diode is thus formed within the boundaries defined by layers 12 and 16.

Therefore, the total distance which is required between Schottky diodes is the amount of space determined by the misalignment of metallic layer 20 with respect to layers 12 and 16, which for a 2-micron process must never be less than at least 1 micron.

Lightly N-doped programmable material 22 selected from the group of silicon, germanium, carbon and alpha-tin is then disposed over metallic layer 20. Material 22 exhibits a relatively high resistance so long as the voltage across it does not exceed the threshold level. However, once the threshold voltage is exceeded, the resistance of material 22 irreversibly switches from a high resistance state to a relatively low resistance state.

A metallic address line 24 is then disposed upon and connects with programmable material 22 to complete the memory structure as more completely described in Roesner '507.

Very clearly, based upon fabrication methodologies and circuit structures which have heretofore existed, a memory comprised of devices such as shown in FIG. 1 cannot be fabricated with a greater density than that which allowed approximately 6 microns between the center of one cell and the next adjacent cell.

Therefore, what is needed is a design for a semiconductor memory and a structure for a memory cell whereby the defects of the prior art are overcome and wherein more particularly a higher density read-only memory can be fabricated using a conventional 2-micron process.

BRIEF SUMMARY OF THE INVENTION

The invention is a method of fabricated a read-only memory comprises the steps of selectively disposing a plurality of word lines on a semiconductor substrate. A two-dimensional diode layer is disposed on the word lines and substrate. An insulating layer is selectively disposed on the diode layer. The insulating layer has a plurality of apertures defined therein. Each aperture is approximately aligned with one of the underlyed word lines. A two-dimensional metallic layer is selectively disposed within each of the apertures defined in the insulating layer in contact with the underlying diode layer to form a Schottky diode therebetween. A programmable layer is disposed in contact with at least the metallic two-dimensional layers disposed within the apertures defined in the insulating layer. A plurality of conductive bit lines are disposed on the programmable layer. Each bit line is approximately aligned with at least one of the underlying Schottky diodes formed between the two-dimensional metallic layer and the underlying portion of the two-dimensional diode layer. As a result, the read-only memory is fabricated with only two alignment steps so that bit line pitch and word line pitch are each substantially decreased.

In the step of disposing the programmable layer in a first embodiment, the programmable layer is disposed as a integral two-dimensional layer in contact with the insulating layer and the metallic layer formed part of the Schottky diode.

In a second embodiment in the step of disposing the programmable layer, the programmable layer is selectively disposed to form a corresponded plurality of twodimensional contact pads. Each contact pad of the programmable layer is in electrical contact with only one of the two-dimensional metallic layers disposed in the apertures and forms part of the Schottky diode.

In the step of disposing the two-dimensional diode layer, what is disposed is a doped semiconductive material with a vertical resistivity of at least $10^9$ ohms per square.

In the step of disposing the programmable layer, a layer of material selected from a group comprised of silicon germanium. carbon and alpha-tin with a doped concentration of less than $10^{17}$ dopant atoms per cubic centimeter is disposed and the programmable layer is never subjected to a temperature above 600 degrees C.

The invention is also an electrical programmable read-only memory having memory cells in an insulating layer which overlies a semiconductor substrate. The invention comprises a semiconductor substrate, a plurality of conductive word lines disposed on the substrate, and a first semiconductor material having a polycrystalline grain structure formed as a two-dimensional layer on the plurality of word lines and the substrate. An insulating layer is disposed upon the first semiconductor material. The insulating layer has a plurality of apertures defined therethrough to expose portions of the first semiconductor material. Each of the apertures defined in the insulating layer is approximately aligned with one of the word lines disposed beneath the aperture and the first semiconductor material. A metallic compound is disposed into contact with the first semiconductor material and forms a plurality of Schottky diodes therewith. The metallic compound is disposed in the form of a two-dimensional layer within each of the apertures in the insulating layer. A Schottky diode is formed in each of the plurality of apertures. A second semiconductor layer is disposed at least within the apertures in electrical contact with the metallic compound. The second semiconductor layer is composed of semiconductor material having a first and second electrical state. The semiconductor material is electrically and permanently configured to the second electrical state from the first electrical state upon application of a threshold signal to the second semiconductor material. A plurality of conductive bit lines is disposed on the second semiconductor material and aligned at least with the metallic compound underlying the second semiconductor material. As a result, cell densities in the memory is increased and the bit line and word line pitch decreased without any increase in fabrication and alignment tolerances by which the memory is constructed.

In one embodiment the second semiconductor layer is disposed on the insulating layer and the metallic compound as a two-dimensional layer having an area substantially larger than at least one memory cell and is disposed thereon without regard to alignment to underlying structure.

In another embodiment the second semiconductor layer is disposed on the underlying metallic compound in the form of a plurality of two-dimensional pads. Each pad is disposed at least in part in the aperture defined within the insulating layer and is in contact at least in part with the metallic compound.

The first electrical state of the second semiconductor layer is a state characterized by high vertical electrical resistivity and the second electrical state is a state characterized by low vertical electrical resistivity. The signal, which irreversibly configures the second semiconductor material from the first electrical state to the second electrical state, is a voltage which exceeds a predetermined threshold voltage and which is applied across at least a portion of the second semiconductor material. Only that portion subjected to the threshold voltage is configured from the first electrical state to the second electrical state. The remaining portion of the second semiconductor material, which is not exposed to the threshold voltage, remains in the first electrical state of high vertical resistivity.

The second semiconductor material is selected from the group comprised of silicon, germanium, carbon and alpha-tin having a crystalline grain size which is smaller than that of the first semiconductor material and haved a concentration of dopant atoms of less than $10^{17}$th per cubic centimeter.

The first semiconductor material is subjected to temperatures of over 600 degrees C. whereas the second semiconductor material is subjected to temperatures of only less than 600 degrees C. to achieve its relatively large and small grain size as compared to the first semiconductor material.

The invention can also be characterized as an improvement in a method of fabricated a read-only memory in an integrated circuit having a plurality of conductive word lines and a plurality of conductive bit lines. The plurality of word lines is generally orthogonally oriented with respect to the plurality of bit lines. The read-only memory has a plurality of memory cells. The memory cells are vertically disposed within the integrated circuit between the plurality of word lines and the plurality of bit lines. The improvement comprises the steps of disposing a two-dimensional semiconductor diode layer of material on a selected one of either the plurality of word lines or plurality of bit lines, whichever is first disposed on an underlying supported semiconductor substrate. The diode material is disposed as a two-dimensional layer without regard to alignment of the selected one of the plurality of bit lines or word lines. A plurality of Schottky diodes is selectively formed in the diode material. The formation is executed so as to approximately align each one of the Schottky diodes with at least one of the plurality of word lines or bit lines upon which the diode material is disposed. A programmable material is disposed in electrical communication with at least each one of the plurality of Schottky diodes. The programmable material is characterized by a high resistivity state reconfigurable to a low resistivity state. The programmable material is irreversibly configured between the two resistivity states by application of a threshold voltage. The threshold voltage alters the electrical state of the programmable material only in the proximity of that portion of the programmable material to which the threshold voltage has been applied. The other one of the plurality of bit lines or word lines is selectively disposed on the programmable material. The other one of the plurality of bit lines or word lines is aligned, when disposed, with at least one of the underlying Schottky diodes. As a result, a read-only memory is fabricated with the necessity for only two alignments between overlying and underlying related elements within the memory so that bit line pitch and word line pitch may be decreased and memory cell density increased.

Refer now to the following drawings wherein like elements are referenced by like numerals.

BRIEF DESCRIPTION OF THE DRAWINGS

FIG. 2 is a cross-sectional view of a memory fabricated according to the invention having a structure according to the invention wherein memory density is increased by 30% or more while still using a 2-micron process.

FIG. 2 illustrates a cross section across the word lines, whereas FIG. 3 illustrates a cross section across the bit lines.

FIG. 4 is a perspective of the embodiment of FIGS. 2 and 3 shown in cutaway view.

Figure 1:
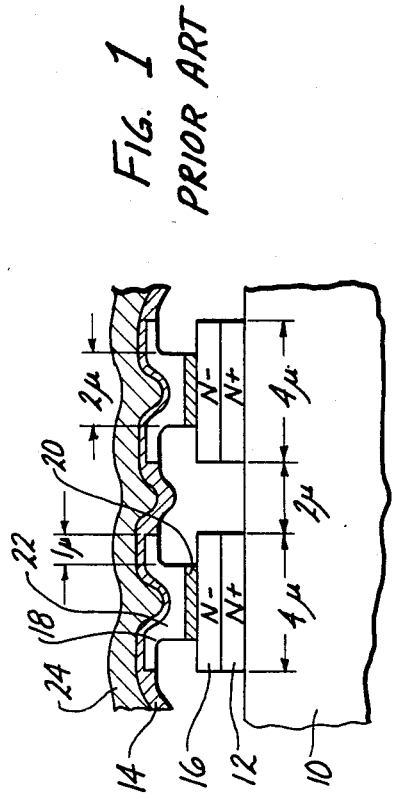
FIG. 1 is a cross-sectional diagrammatic partial view of a prior art memory showing two adjacent memory cells such as the type shown and described in connection with U.S. Pat. No. 4,442,507.

The invention and its various embodiments may be better understood by now turning to the following detailed description.

DETAILED DESCRIPTION OF THE PREFERRED EMBODIMENT

The word line pitch within a read-only memory may be decreased, thereby increasing the cell density within the memory, without imposing any additional or stricter spacing rules or fabrication techniques utilized in the manufacture of the readonly memory integrated circuit chip. The read-only memory is comprised of a plurality of memory cells, each cell of which includes a Schottky diode serially coupled to an electrically programmable resistive element. The resistive elements in a Schottky diode are serially coupled between a corresponding bit line and word line. Application of a voltage exceeding a predetermined threshold of voltage to the resistive element causes the resistive element to irreversibly convert from a high resistive state to a lower resistive state. A read-only memory is fabricated by a methodology wherein a two-dimensional semiconductor diode layer is laid down on a plurality of word lines which have previously been disposed upon a semiconductor supporting substrate. The semiconductor diode layer is disposed on the plurality of word lines without regard to any alignment criteria. A plurality of Schottky diodes is then defined in the semiconductor diode layer. Each Schottky diode is aligned with one of the underlying word lines in a one-to-one mapping. A programmable material is inlaid on the Schottky diodes and the plurality of bit lines laid upon the programmable material. The bit lines are aligned with the underlying Schottky diodes so that the Schottky diodes are again electrically coupled through the programmable material to one bit line in a one-to-one mapping. The bit lines are orthogonally disposed with respect to the Schottky diodes so that each diode is uniquely addressed by one word line and one bit line. The programmable material may be laid upon the Schottky diode as a two-dimensional layer or as a plurality of strips or paths without regard to any alignment criteria. Because a single alignment is required in each of two orthogonal dimensions between the word line and the Schottky diode in one dimension, or the bit line and Schottky diode in another dimension, the center-to-center word line or bit line pitch may be reduced to four microns and utilizing a fabrication methodology based a two-micron rule. As a result, at least a thirty percent reduction in the amount of space required for each dimension of the cell is realized.

FIG. 2 illustrates in cross-sectional view a device fabricated according to the invention within a 2-micron rule. Word lines 12 are disposed in a conventional manner on insulating substrate 10 using the same process by which the same word lines 12 were created in connection with the prior art device illustrated in FIG. 1. However, word lines 12 are defined by a single masking step and, when the lightly N doped diode layer 16' is disposed upon the device, the entire diode layer 16' is left in contact and intact rather than being subsequently etched to form diode pads 16 as in the case of the prior art device of FIG. 1.

The vertical resistivity of the lightly N doped layer 16' is high enough, i.e., more than $10^9$ ohms per square, that word lines 12 which are mutually connected to the twodimensional layer 16' nevertheless remain electrically isolated.

As before, an insulating layer 14 is then disposed on top of diode layer 16' followed by the opening of contact apertures 18 through a conventional photolithographic process. However, the Schottky diode programmable layers 22 are disposed on the substrate so as to be coincident or nearly coincident with underlying word lines 12.

The device is completed by then disposing and defining programmable layers 22 within apertures 18 on Schottky metallic layers 20 followed by selective deposition of a metallic bit line 24.

The semiconductor layer is fabricated by depositing either silicon or germanium which is doped in situ on the deposited surface. The diode layer is then annealed at temperatures above 600 degrees C. to activate the dopant atoms. On the other hand, the programmable layer is a semiconductor material which is maintained at all points during the fabrication at temperatures at or below 600 degrees C.

It may be readily appreciated by examination of FIG. 2 that by being able to align the Schottky contact layer 20 with underlying word line 12, the word line pitch within the semiconductor memory becomes 4 microns from the center of one cell to the next under a 2-micron rule, rather than the 6-micron word line pitch which was the best that could be achieved under the prior art design of FIG. 1.

However, according to the invention, not only the word line pitch but also the bit line pitch is decreased. Turn for example to the cross-sectional view of FIG. 3 which is a section taken through the device of FIG. 2, which is orthogonal to the view illustrated in FIG. 2, and is perpendicular across the bit lines and parallel to the word lines as seen through lines 3—3 of FIG. 2. It can be readily appreciated by examining FIG. 3 that under a 2-micron rule, bit lines 24 may be spaced one from each other as close as 2 microns and in turn may have a width of 2 microns. No spacing limitation or restriction arises due to any feature of the underlying structure.

For example, programmable layer 22 has a high enough resistivity such that it may be left in place such as is shown between devices 26 and 28 or may be etched away as depicted between devices 28 and 30. As long as the interconnecting material of programmable layer 22 remains in its high resistance state, no interfering crosstalk between the adjacent cells occurs.

In any case, the bit line pitch from the center of one bit line to the next adjacent bit line, as illustrated in FIG.

3, is approximately 4 microns since again the only alignment which must be undertaken is a single alignment of the overlying bit line 24 with the underlying Schottky diode layer 20. Neither programmable layer 22 nor underlying diode layer 16 nor word line 12 require any alignments during the fabrication process.

Figure 3:
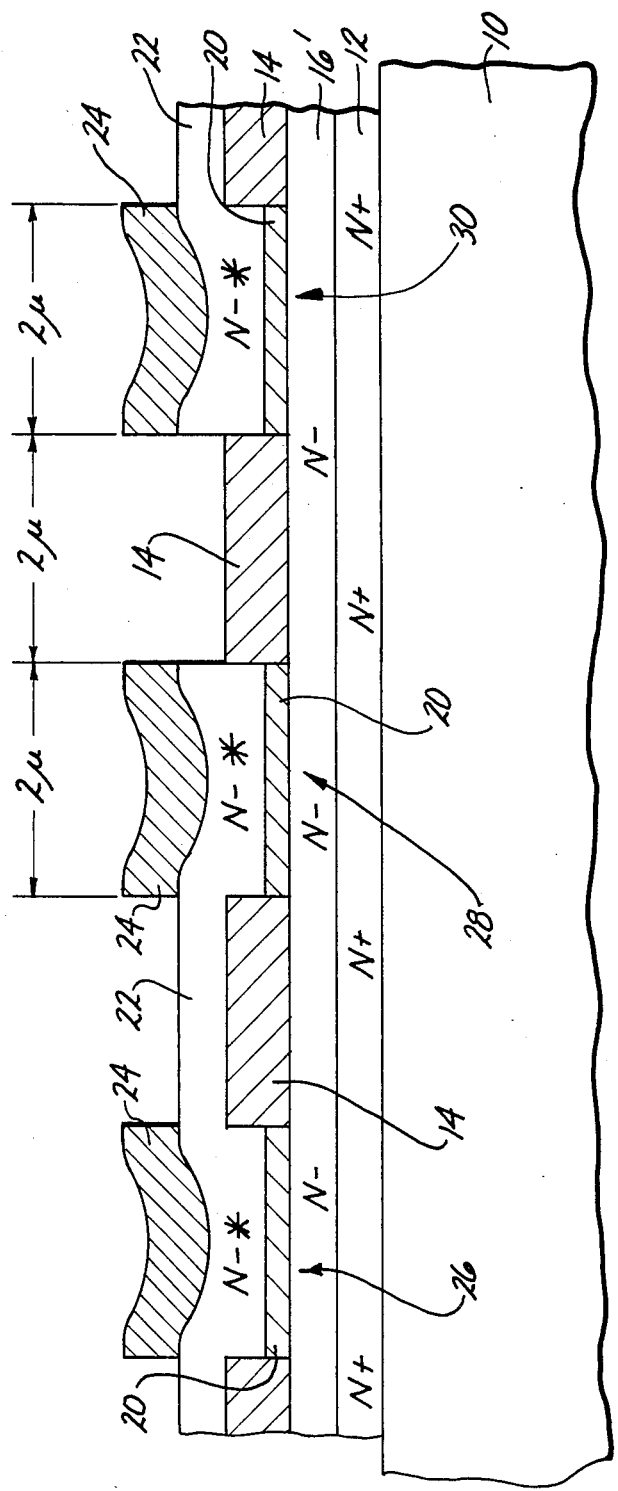
FIG. 3 is a cross-sectional view of the memory of FIG. 2 taken through an orthogonal direction to the sectional view of FIG. 2.

FIG. 4 is a perspective of the embodiment of FIGS. 2 and 3 which provides a graphic two-dimensional image of the fact that the alignments which need to be made in a read-only memory according to the invention is the alignment of the Schottky diode layer 20 with underlying word line 12; that the alignment which is made is only in the X direction as depicted in FIG. 4; and that an alignment of the overlying bit line 24 and the underlying Schottky diode 20 is the only alignment made in the Y dimension of FIG. 4. No alignment occurs with respect to diode layer 16' nor programmable layer 22 inasmuch as either one or both of these layers may be a two-dimensionally integral and contiguous layer within the entire memory.

The illustrated embodiments have been shown only for the purposes of example and should not be taken as limiting the invention which is defined by the following claims. It must be understood that many modifications may be made by those having ordinary skill in the art without departing from the spirit and scope of the invention.

I claim:

1. An electrical programmable read-only memory comprising:
   a semiconductor substrate;
   a plurality of conductive word lines disposed on said substrate;
   a first semiconductor material having a polycrystalline grain structure disposed on and between said plurality of word lines and on said substrate, said first semiconductor material having a sufficiently high lateral resistivity to avoid significant electrical conduction between adjacent ones of said conductive word lines, thereby avoiding limitations on the closeness of spacing of said conductive word lines to each other on said substrate, which limitations would have otherwise been encountered if said first semiconductor material were selectively disposed on said word lines;
   an insulating layer disposed upon said first semiconductor material, said insulating layer having a plurality of apertures defined therethrough exposing portions of said first semiconductor material, each of said apertures defined in said insulating layer being approximately aligned with one of said word lines disposed beneath said aperture and said first semiconductor material;
   a metallic compound in contact with said first semiconductor material forming a plurality of Schottky diodes therewith, said metallic compound being disposed in the form of a two-dimensional layer within each of said apertures in said insulating layer, a Schottky diode being formed in each of said plurality of apertures;
   a second semiconductor layer disposed at least within said apertures in electrical contact with said metallic compound, said second semiconductor layer composed of semiconductor material having a first and second electrical state, said semiconductor material of said second semiconductor layer being electrically and permanently configured to said second electrical state from said first electrical state upon application of a threshold signal to said second semiconductor material; and
   a plurality of conductive bit lines disposed on said second semiconductor layer and aligned at least with said metallic compound underlying said second semiconductor layer,
   whereby cell densities in said memory is increased and having a decreased bit line and word line pitch without any increase in fabrication and alignment tolerances by which said memory is constructed.

2. The memory of claim 1 wherein said second semiconductor layer is disposed on said insulating layer and said metallic compound as a two lateral dimensional layer having an area substantially larger than at least one memory cell and disposed thereon without regard to alignment to structure underlying said metallic compound.

3. The memory of claim 1 wherein said second semiconductor layer is disposed on said underlying metallic compound in the form of a plurality of two lateral dimensional pads each pad being disposed at least in part in said aperture defined within said insulating layer and in contact at least in part with said metallic compound.

4. The memory of claim 1 wherein said first electrical state of said second semiconductor layer is a state characterized by high vertical electrical resistivity and wherein said second electrical state is a state characterized by low vertical electrical resistivity, said signal, which irreversibly configures said second semiconductor material from said first electrical state to said second electrical state, being a voltage exceeding a predetermined threshold voltage applied across at least a portion of said second semiconductor material, only that portion being subjected to said threshold voltage being configured from said first electrical state to said second electrical state, the remaining portion of said second semiconductor material, which is not exposed to said threshold voltage, remaining in said first electrical state of high vertical resistivity.

5. The memory of claim 2 wherein said first electrical state of said second semiconductor layer is a state characterized by high vertical electrical resistivity and wherein said second electrical state is a state characterized by low vertical electrical resistivity, said signal, which irreversibly configures said second semiconductor material from said first electrical state to said second electrical state, being a voltage exceeding a predetermined threshold voltage applied across at least a portion of said second semiconductor material, only that portion being subjected to said threshold voltage being configured from said first electrical state to said second electrical state, the remaining portion of said second semiconductor material, which is not exposed to said threshold voltage, remaining in said first electrical state of high vertical resistivity.

6. The memory of claim 5 wherein said second semiconductor material consists essentially of a single element semiconductor selected from a group of silicon, germanium, carbon and alpha-tin having a crystalline grain size which is smaller than that of said first semiconductor material and having a concentration of dopant atoms of less than $10^{17}$ per cubic centimeter.

7. The memory of claim 6 wherein said second semiconductor material is comprised of relatively smaller grain size silicon than said first semiconductor material, said first semiconductor material being subjected to temperatures of over 600 degrees C. whereas said second semiconductor material is subjected to temperatures of only less than 600 degrees C. to achieve its relatively smaller grain sizes as compared to said first semiconductor material.

8. An electrical programmable read-only memory having memory cells in an insulating layer which overlies a semiconductor substrate comprising:
   a semiconductor substrate;
   a plurality of conductive word lines disposed on said substrate;
   a first semiconductor layer composed of semiconductor material having a polycrystalline grain structure formed as a two lateral dimensional layer on and between said plurality of word lines and on said substrate without selective delineation of said first semiconductor layer with respect to said word lines, said first semiconductor material having a sufficiently high lateral resistivity to avoid significant electrical conduction between adjacent ones of said conductive word lines, thereby avoiding limitations on the closeness of spacing of said conductive word lines to each other on said substrate which limitations would have otherwise been encountered if said first semiconductor layer were selectively disposed on said word lines;
   an insulating layer disposed upon said first semiconductor layer, said insulating layer having a plurality of apertures defined therethrough exposing portions of said first semiconductor layer, each of said apertures defined in said insulating layer being approximately aligned with one of said word lines disposed beneath said aperture and said first semiconductor layer;
   a metallic compound in contact with said first semiconductor layer forming a plurality of Schottky diodes therewith, said metallic compound being disposed in the form of a two lateral dimensional layer within each of said apertures in said insulating layer, a Schottky diode being formed in each of said plurality of apertures;
   a second semiconductor layer disposed at least within said apertures in electrical contact with said metallic compound, said second semiconductor layer composed of semiconductor material having a first and second electrical state, said semiconductor material being electrically and permanently configured to said second electrical state from said first electrical state upon application of a threshold signal to said semiconductor material of said second semiconductor layer; and
   a plurality of conductive bit lines disposed on said second semiconductor layer and aligned at least with said metallic compound underlying said second semiconductor layer,
   whereby cell densities in said memory are increased and having a decreased bit line and word line pitch without any increase in fabrication and alignment tolerances by which said memory is constructed.

9. An electrical programmable read-only memory comprising:
   a semiconductor substrate;
   a plurality of conductive word lines disposed on said substrate;
   a first semiconductor layer composed of semiconductor material having a polycrystalline grain structure formed as a two lateral dimensional layer on and between said plurality of word lines and on said substrate without registration of any kind with respect to said underlying word lines, said first semiconductor material having a sufficiently high lateral resistivity to avoid significant electrical conduction between adjacent ones of said conductive word lines, thereby avoiding limitations on the closeness of spacing of said conductive word lines to each other on said substrate which limitations would have otherwise been encountered if said first semiconductor layer were selectively disposed on said word lines;
   an insulating layer disposed upon said first semiconductor layer, said insulating layer having a plurality of apertures defined therethrough exposing portions of said first semiconductor layer, each of said apertures defined in said insulating layer being approximately aligned with one of said word lines disposed beneath said aperture and said first semiconductor layer;
   a metallic compound in contact with said first semiconductor layer forming a plurality of Schottky diodes therewith, said metallic compound being disposed in the form of a two lateral dimensional layer within each of said apertures in said insulating layer, a Schottky diode being formed in each of said plurality of apertures;
   a second semiconductor layer disposed at least within said apertures in electrical contact with said metallic compound, said second semiconductor layer composed of semiconductor material having a first high resistivity and second low resistivity electrical state, selected portions of said semiconductor material of said second semiconductor layer being electrically and permanently configured to said second low resistivity electrical state from said first high resistivity electrical state upon application of a threshold signal to said selected portions of said second semiconductor layer in contact with said metallic compound, said second semiconductor layer disposed in and between said apertures defined in said insulating layer; and
   a plurality of conductive bit lines disposed on said second semiconductor layer and aligned at least with said metallic compound underlying said second semiconductor layer but without registration of any kind with respect to said underlying second semiconductor layer,
   whereby cell densities in said memory are increased and having a decreased bit line and word line pitch without any increase in fabrication and alignment tolerances by which said memory is constructed.

10. An electrical programmable read-only memory comprising:
    a semiconductor substrate;
    a plurality of conductive word lines disposed on said substrate;
    a first semiconductor layer composed of semiconductor material having a polycrystalline grain structure disposed on said plurality of word lines and on said substrate;
    an insulating layer disposed upon said first semiconductor layer, said insulating layer having a plurality of apertures defined therethrough exposing portions of said first semiconductor layer, each of said apertures defined in said insulating layer being approximately aligned with one of said word lines disposed beneath said apertures and said first semiconductor layer;
    a metallic compound in contact with said first semiconductor layer forming a plurality of Schottky diodes therewith, said metallic compound being disposed in the form of a two lateral dimensional layer within each of said apertures in said insulating layer, a Schottky diode being formed in each of said plurality of apertures;

a second semiconductor layer disposed at least within said apertures in said insulating layer in electrical contact with said metallic compound, said second semiconductor layer composed of semiconductor material having a first high resistivity and second low resistivity electrical state, selected portions of said second semiconductor material being electrically and permanently configured to said second low resistivity electrical state from said first high resistivity electrical state upon application of a threshold signal to said selected portions of said second semiconductor material in contact with said metallic compound, said second semiconductor layer disposed in and between said apertures defined in said insulating layer; and a plurality of conductive bit lines disposed on said second semiconductor layer and aligned at least with said metallic compound underlying said second semiconductor layer but without registration of any kind with respect to said underlying second semiconductor layer, thereby avoiding limitations on the closeness of spacing of said conductive bit lines to each other on said insulating layer which limitations would have otherwise been encountered if said second semiconductor layer were selectively disposed on said insulating layer;

whereby cell densities in said memory are increased and having a decreased bit line and word line pitch without any increase in fabrication and alignment tolerances by which said memory is constructed.

* * * * *